United States Patent [19]

Seidler

[11] Patent Number: 4,697,865
[45] Date of Patent: Oct. 6, 1987

[54] EDGE CLIP AND TERMINAL

[75] Inventor: Jack Seidler, Flushing, N.Y.

[73] Assignee: North American Specialties Corp., College Point, N.Y.

[21] Appl. No.: 750,854

[22] Filed: Jul. 1, 1985

Related U.S. Application Data

[63] Continuation-in-part of Ser. No. 569,800, Jan. 11, 1984, abandoned, which is a continuation-in-part of Ser. No. 336,630, Jan. 4, 1982, abandoned, which is a continuation-in-part of Ser. No. 230,907, Feb. 2, 1981, Pat. No. 4,367,910.

[51] Int. Cl.⁴ .................... H01R 4/02; H01R 13/11
[52] U.S. Cl. .................................. 439/861; 439/876
[58] Field of Search ............ 339/17 C, 17 LM, 17 M, 339/258 R, 258 P, 275 B, 275 T, 276 SF, 275 R

[56] References Cited

U.S. PATENT DOCUMENTS

| | | | |
|---|---|---|---|
| 2,468,368 | 4/1949 | Jackson | 339/258 P |
| 3,764,955 | 10/1973 | Ward | 339/176 MP |
| 4,120,558 | 10/1978 | Seidler | 339/275 T |
| 4,203,648 | 5/1980 | Seidler | 339/275 T |
| 4,367,910 | 1/1983 | Seidler | 339/275 B |

FOREIGN PATENT DOCUMENTS 843797   8/1960   United Kingdom .......... 339/17 LM Primary Examiner—Gil Weidenfeld
Assistant Examiner—Gary F. Paumen
Attorney, Agent, or Firm—Darby & Darby

[57] ABSTRACT

An edge clip for attachment to a contact pad on a substrate includes a pair of spaced-apart spring fingers, adapted to receive the edge of the substrate therebetween. One or both of the fingers may at least partially encircle and support a mass of solder. The fingers are joined to the body portion with a folded connecting portion integral with the body between its ends, and one or more folded end portions, aligned with the connecting portion, can be supported from carrier rails at one or both ends during manufacture.

3 Claims, 13 Drawing Figures

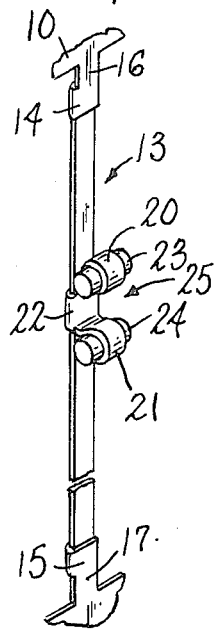
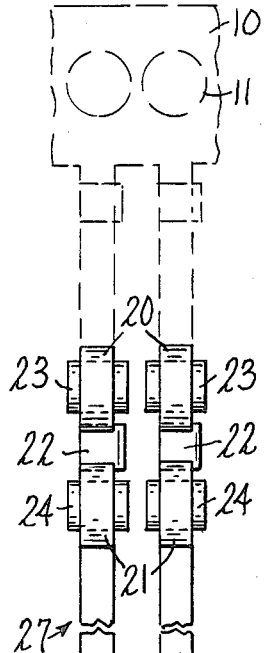
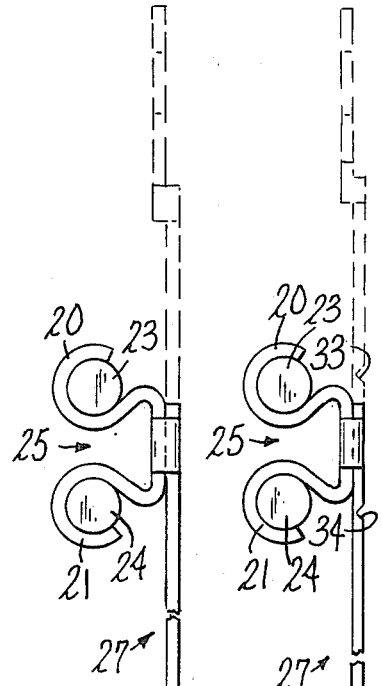
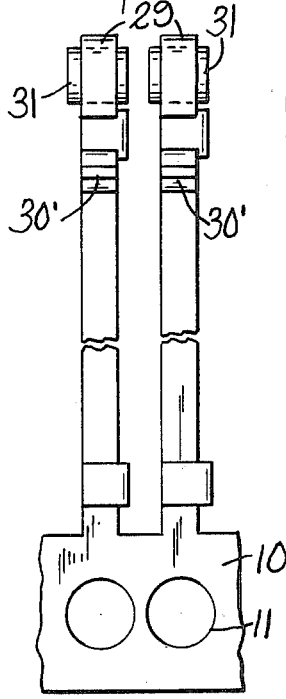
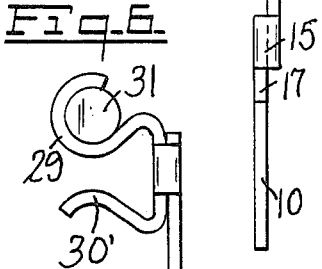

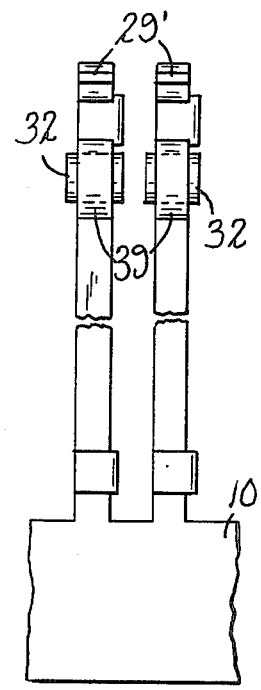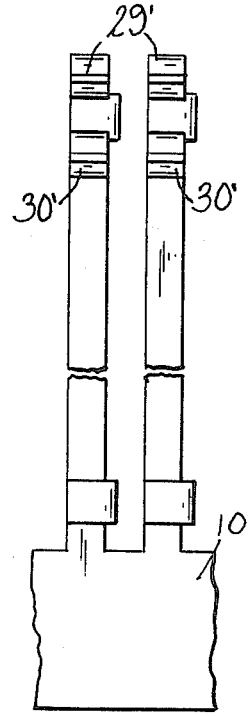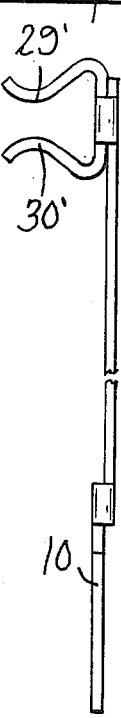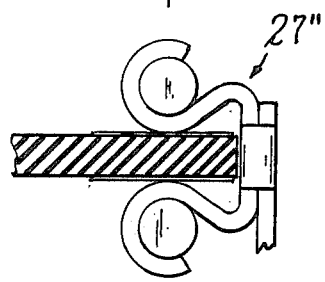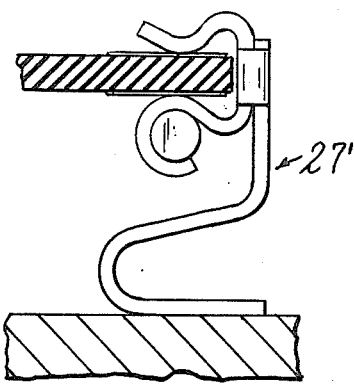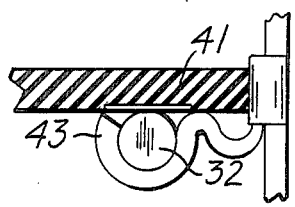

EDGE CLIP AND TERMINAL

The present application is a continuation-in-part of copending application Ser. No. 569,800, filed Jan.11 1984 for "EDGE CLIP" in the name of Jack Seidler now abandoned, which in turn is a continuation-in-part of prior application Ser. No. 336,630, filed Jan. 4, 1982 for "EDGE CLIP AND METHOD OF MANUFACTURE", in the name of Jack Seidler (now abandoned), which in turn is a continuation-in-part of application Ser. No. 230,907 for "MINI-TERMINAL" filed Feb. 2, 1981 in the name of Jack Seidler, now U.S. Pat. No. 4,367,910, issued Jan. 11, 1983.

FIELD OF THE INVENTION

This invention relates generally to terminal clips or edge clips for attachment to contact pads on a circuit-bearing board, chip or other substrate. The clip is preferably of the type having solder mechanically engaged with the clip in a position to be melted for bonding the clip to the contact pad. More particularly, the present invention relates to such a clip which is manufactured from a relatively wide blank of stock material which is folded upon itself to form a very narrow clip, whereby the pitch or distance between adjacent clips can be considerably reduced relative to prior art devices.

PRIOR ART

Various terminal clips are known in the prior art which have a quantity of solder associated therewith so that when the clip has been positioned on a contact pad of a circuit-bearing substrate and the assembly heated, the molten solder covers the adjacent surfaces of the clip and pad to form, when cool, a soldered metallurgical joint between the clip and pad. For instance, various arrangements of solder-holding and/or pad-contacting fingers are disclosed in Seidler U.S. Pat. Nos. 4,120,558 and 4,203,648, in each of which the body portions from which the fingers are formed are flat and wide enough so that each of the fingers will have adequate strength for its intended purposes.

However, an increased commercial need for miniaturization in this field has resulted in reduction of the size and spacing between the contact pads on the circuit-bearing substrate. Since such pads are fully supported by the material of the substrate, no difficulty is encountered by the reduced size and spacing of such contact pads. The terminal clips which are attached to the pads, on the other hand, must also be reduced in size to enable reduced spacing thereof for attachment to the more closely spaced pads on the circuit-bearing substrate. Construction of the terminal clips in accordance with the prior art may result in the clips not having enough inherent strength to be self-supporting as they are applied to the pads, or to maintain good electrical contact with their respective pads while being soldered.

It is not economical to increase the gauge of the stock material from which the terminals are stamped since a very thin strip is electrically satisfactory. Applicant's co-pending U.S. Pat. No. 4,367,910, describes one solution to this problem. In this application, the terminal clip is stamped from a relatively wide piece of stock material and then folded upon itself to achieve a narrower configuration while retaining sufficient inherent strength to be self-supporting. In the co-pending patent, the terminal clips are supported from one end on a carrier strip and have free ends which are unsupported. Elongate slits are made from the free end to define parallel, separate sections of the blank which are then folded in a desired manner to provide spring fingers. In that method of manufacture, the clip is supported only from one end.

SUMMARY OF THE INVENTION

Accordingly, it is a principal object of the present invention to provide a terminal clip or edge clip for attachment to a contact pad on a circuit-bearing substrate, where the edge clip is made from a relatively wide blank or piece of stock material and folded upon itself to provide a narrow edge clip which has sufficient inherent strength to be self-supporting.

A further object of the invention is to provide an edge clip having a pair of spaced-apart spring fingers for receiving the edge of a circuit-bearing substrate therebetween, where the fingers have a width substantially as great as the width of the clip body and are disposed in overlying relation to the clip body to define a narrow clip.

A still further object of the invention is to provide an edge clip made from a blank or piece of stock material, in which the blank is supported from one or both ends on carrier strips or rails during the manufacturing process.

In one form, a planar blank is formed to constitute an elongate body portion joined via lateral fold portions with stubs connected to spaced carrier strips or rails, with a pair of parallel spring fingers extending in opposite directions away from a common connecting and fold portion integral with an edge of the body portion intermediate the ends of the body portion. The fingers and stubs are in alignment with one another and define a support axis for the blanks.

One end of the body portion may be separated from the carrier strip near the fold portion to which the fingers are connected, leaving a strip of terminal or edge clips carried by one carrier strip and having a free end with the spring fingers thereon for receiving the edge of a circuit-bearing substrate therebetween. If desired, the other carrier strip can be separated from the body portion after the fingers have been attached to the edge of a circuit-bearing substrate, defining a shorting edge clip.

BRIEF DESCRIPTION OF THE DRAWINGS

With particular reference to the drawings, several forms of the invention are illustrated in the various figures wherein like reference characters designate like parts throughout the several views, and wherein:

FIG. 1 represents a perspective view of an individual clip, the carrier rails being broken away;

FIG. 2 represents an elevational view of a pair of adjacent clips carried on a single rail, the position of the (removed) second rail being indicated in broken lines;

FIG. 3 represents an edge view of the clips shown in FIG. 2;

FIG. 4 represents a view like FIG. 3, showing breakaway notches to facilitate separating of the clip body from either or both carrier rails;

FIG. 5 represents an elevational view of a pair of clips, as in FIG. 2, showing a first modified form of clip, having solder held only in the upper fingers;

FIG. 6 represents an edge view of the clip shown in FIG. 5;

FIG. 7 represents an elevational view of a pair of clips, as in FIGS. 2 and 5, howing a second modified form of clip, having a solder mass held only in the lower fingers;

FIG. 8 represents an edge view of the clips shown in FIG. 7;

FIGS. 9 and 10 are elevation and side edge views, respectively, of a third modification of the invention, the fingers carrying no solder; and FIGS. 11 and 12 are diagrammatic edge views of two typical applications, respectively, of the edge clips according to the invention; and FIG. 13 is a fragmentary diagrammatic edge view of a modified form of solder-carrying finger useful in the invention.

DETAILED DESCRIPTION OF THE PREFERRED EMBODIMENTS

In the manufacture of the edge clip according to the invention, a strip of stock material is supplied from a reel, not shown, to a power press or stamping machine, not shown. A series of punches and dies are arranged in the power press to perform a series of successive stamping operations on the ribbon or strip of material as it passes through the machine.

In accordance with conventional practice, carrier strips 10 are provided, each having a series of pilot holes 11 formed therein for indexing the ribbon through the various stages of the power press or stamping machine. Each clip comprises an elongated body portion 13 having fold portions 14 and 15 folded to lie flat against the body portion at opposite ends thereof, respectively, and connected with stub members 16 and 17, which have a width substantially equal to that of the body and extend in opposite directions parallel to the length of the body; the stub members are initially joined with the respective carrier strips. A pair of finger-forming tabs 20 and 21, also having a width substantially equal to that of the body, project in longitudinally opposite directions from a connecting and fold portion 22, integral with an edge of the body portion 13 intermediate the ends thereof and folded to lie flat against the body portion, as shown in FIG. 1. The tabs 20 and 21 are shown in FIGS. 1 to 5 as being bent to partially encircle (through more than 180°) slugs of solder 23, 24, while projecting laterally from the face of the body portion to constitute a pair of spaced-apart spring fingers defining a receiving gap 25 for a circuit board, chip, or other substrate.

Thus, as can be seen from the foregoing, a relatively narrow terminal or edge clip is provided, in which each of the respective portions of the blank, folded 180° in the same direction about a common axis to form the various elements of the clip, has a width substantially as wide as the widest part of the clip, thereby ensuring maximum strength for each part of the clip.

As seen in FIGS. 2 and 3, the upper end of the body portion and its associated carrier strip are removed, leaving a strip of terminals 27 carried by the lower carrier strip or rail 10 and having the spring fingers 20 and 21 on the free ends thereof for attachment to the edge of a circuit-bearing substrate.

The edge clips 27 shown in FIGS. 2 and 3 may substantially be further deformed to define a direct attach clip 27', as shown in FIG. 12.

Alternatively, as shown in FIGS. 4 and 11, the body 13 may be provided with one or a pair of break-away notches 33 and 34 adjacent to the point of attachment with the spring fingers, whereby the removal of opposite ends of the body is facilitated, i.e., in order to form a shorting edge clip 27", as illustrated in FIG. 11.

In FIGS. 5 and 6, a modification is shown wherein a slug of solder 31 is carried only by the top finger 29, and the bottom inger 30' is shortened and serves merely as a spring finger cooperating with the spring finger 29 in attaching the clip to the edge of a board.

FIGS. 7 and 8 show a similar arrangement wherein the slug of solder 32 is carried only by the bottom finger 39, while the top finger 29' is shortened and serves merely as a spring finger which cooperates with finger 39 to attach the clip to the edge of the board.

In FIGS. 9 and 10, neither of the fingers 29' or 30' carries any solder, and both the fingers are shortened and merely grip the edge of a board, chip, or other substrate therebetween.

With the relatively narrow edge clips of the present invention, pitches as small as .050" may be readily used, since each component or element of the clip has a width as great as the width of the clip itself, thus imparting maximum strength to the clips.

While the invention has been disclosed as applied to a clip for a circuit-carrying board or for a chip or other substrate, it will be understood that it can also be applied to a terminal for engagement with a single contact pad on such a substrate. Thus, in place of having two solder-carrying fingers such as 20 and 21 of FIGS. 1–4, or a single solder-carrying finger opposed to a spring finger as at 29, 30' of FIGS. 5–6, a single solder-carrying finger may be used alone, for soldering to a contact pad or other conductive area.

Moreover, although in the various figures the solder-carrying finger is shown curled around the solder mass in a position to be interposed between the solder mass and the contact pad of the substrate, as an alternative as shown in FIG. 13, the solder mass 32 may be in direct contact with a contact pad 41 by having the concave side of the solder-carrying finger 43 facing the contact pad 41 with the solder mass 32 therebetween. This will facilitate flow of the solder into contact with both the contact pad 41 and the finger 43.

It will thus be seen that the objects set forth above, among those made apparent from the preceding description, are efficiently attained, and, since certain changes may be made in the above article without departing from the spirit and scope of the invention, it is intended that all matter contained in the above description and shown in the accompanying drawings shall be interpreted as illustrative and not in a limiting sense.

What is claimed is:

1. A terminal for securement to a contact pad on a substrate, comprising
   a substantially flat elongated body portion,
   a finger portion integral with and substantially parallel to said body portion and joined thereto by a fold portion,
   said finger portion having a section placed substantially flat against said body portion,
   said finger portion having another section bent out of the plane of the body portion to define a contact portion adapted for engagement with said contact pad.

2. A terminal as in claim 1, wherein said finger portion is engaged with a mass of solder.

3. A terminal as in claim 1 wherein the width of said finger portion substantially equals the width of said body portion.

* * * * *